US006609223B1

United States Patent
Wolfgang

(10) Patent No.: US 6,609,223 B1
(45) Date of Patent: Aug. 19, 2003

(54) METHOD FOR PACKET-LEVEL FEC ENCODING, IN WHICH ON A SOURCE PACKET-BY-SOURCE PACKET BASIS, THE ERROR CORRECTION CONTRIBUTIONS OF A SOURCE PACKET TO A PLURALITY OF WILDCARD PACKETS ARE COMPUTED, AND THE SOURCE PACKET IS TRANSMITTED THEREAFTER

(75) Inventor: H. Lewis Wolfgang, Stamford, CT (US)

(73) Assignee: Kencast, Inc., Stamford, CT (US)

( * ) Notice: Subject to any disclaimer, the term of this patent is extended or adjusted under 35 U.S.C. 154(b) by 0 days.

(21) Appl. No.: 09/544,161

(22) Filed: Apr. 6, 2000

Related U.S. Application Data

(60) Provisional application No. 60/128,163, filed on Apr. 6, 1999.

(51) Int. Cl.$^7$ .............................................. H03M 13/00
(52) U.S. Cl. ...................................................... 714/752
(58) Field of Search ................................ 714/752, 755, 714/776

(56) References Cited

U.S. PATENT DOCUMENTS

| | | | |
|---|---|---|---|
| 4,718,066 A | 1/1988 | Rogard ........................ | 714/751 |
| 4,907,277 A | 3/1990 | Callens et al. .............. | 704/202 |
| 5,485,474 A | 1/1996 | Rabin .......................... | 714/762 |
| 5,600,663 A | 2/1997 | Ayanoglu et al. ........... | 714/774 |
| 5,631,907 A | 5/1997 | Guarneri et al. ............ | 370/474 |
| 5,790,524 A | 8/1998 | Bennett et al. ............. | 370/244 |
| 5,959,974 A | 9/1999 | Badt et al. .................. | 370/233 |
| 6,012,159 A * | 1/2000 | Fischer et al. .............. | 714/755 |
| 6,052,819 A | 4/2000 | Barker et al. ................ | 714/776 |
| 6,104,757 A | 8/2000 | Rhee .......................... | 375/240 |
| 6,141,788 A | 10/2000 | Rosenberg et al. ......... | 714/774 |
| 6,289,054 B1 * | 9/2001 | Rhee ..................... | 375/240.27 |
| 6,317,462 B1 * | 11/2001 | Boyce ................... | 375/240.27 |
| 6,336,200 B1 * | 1/2002 | Wolfgang ................... | 714/752 |

OTHER PUBLICATIONS

Michael O. Rabin, "Probabilistic Algorithms in Finite Fields", SIAM J. Comput. vol. 9, No2, May 1980 pp. 273–280.
Michael O Rabin, "Efficient Dispersal of Information for Security, Load Balancing, and Fault Tolerance," Journal of the Assoc. For Computing Machinery vol. 36, No. 2 Apr. 1998 pp 335–348.
R.J. McElience and D.V. Sarwate, "On Sharing Secrets and Reed–Solomon Codes," Communications of the ACM, Sep. 1981 vol. 24.
Adi Shamir, "How to Share a Secret," Communications of the ACM, Nov. 1979, vol. 22, No. 11 pp. 612–613.
C.A. Asmuth and G.R. Blakley, "Proceedings of the 1982 Symposium on Security and Privacy," IEEE Computer Society, Apr. 25–26, 1982 Oakland CA, pp. 156–169.
Ehud D. Karnin, et al. "On Secret Sharing Systems," IEEE Transactions on Information Theory, vol. IT–29, No. 1, Jan. 1983.

* cited by examiner

*Primary Examiner*—Albert Decady
*Assistant Examiner*—Esaw Abraham
(74) *Attorney, Agent, or Firm*—Fitzpatrick, Cella, Harper & Scinto

(57) ABSTRACT

A method is provided for encoding a stream of source packets, in which a plurality of k source packets are packet-level forward error correction encoded to form a plurality of n-k error-correcting wildcard packets, wherein the k source packets and n-k wildcard packets are to be transmitted to a receiver. After the arrival of each source packet, for each byte of the source packet, the respective error correction contributions to the corresponding bytes of the plurality of wildcard packets are computed. The source packet is transmitted to the receiver without waiting for the arrival of another source packet of the plurality of source packets. For each wildcard packet byte, the error correction contribution of the source packet is summed in an accumulator. After the error correction contributions have been computed using all k source packets and summed for all n-k wildcard packets, the wildcard packets are transmitted to the receiver.

3 Claims, 5 Drawing Sheets

FIG. 3

For Each Byte j of source packets, compute:

$$[y_{1j}\ y_{2j}\cdots y_{16j}] = [x_{1j}\ x_{2j}\cdots x_{12j}]\cdot G$$

$$[y_{1j}\ y_{2j}\cdots y_{16j}] = [x_{1j}\ x_{2j}\cdots x_{12j}]\cdot \begin{bmatrix} \overbrace{\begin{matrix} 1 & & 0 \\ & \ddots & \\ 0 & & 1 \end{matrix}}^{12\times 12\ I} & \overbrace{\begin{matrix} g_{13,1} & g_{14,1} & g_{15,1} & g_{16,1} \\ \vdots & \vdots & \vdots & \vdots \\ g_{13,12} & g_{14,12} & g_{15,12} & g_{16,12} \end{matrix}}^{12\times 4\ \text{submatrix}} \end{bmatrix}$$

$$y_{ij} = x_{ij} \qquad i = 1,\ldots,12$$

WILDCARD COMPUTATIONS $$e_{1j} = y_{13j} = \underbrace{x_{1j}\,g_{13,1}}_{\substack{\text{Contributions}\\\text{for packet }X_1,\\\text{byte }j}} + \underbrace{x_{2j}\,g_{13,2}}_{\substack{\text{Contributions}\\\text{for packet }X_2,\\\text{byte }j}} + \ldots + \underbrace{x_{12j}\,g_{13,12}}_{\substack{\text{Contributions}\\\text{for packet }X_{12},\\\text{byte }j}}$$

$$e_{2j} = y_{14j} = x_{1j}\,g_{14,1} + x_{2j}\,g_{14,2} + \ldots + x_{12j}\,g_{14,12}$$

$$e_{3j} = y_{15j} = x_{1j}\,g_{15,1} + x_{2j}\,g_{15,2} + \ldots + x_{12j}\,g_{15,12}$$

$$e_{4j} = y_{16j} = x_{1j}\,g_{16,1} + x_{2j}\,g_{16,2} + \ldots + x_{12j}\,g_{16,12}$$

FIG. 5

For Each Byte j of source packets, compute:

When $x_{10} = x_{11} = x_{12} = 0$ $$[y_{1j} \cdots y_{9j}\, y_{13j}\, y_{14j}\, y_{15j}] = [x_{1j} \cdots x_{9j}] \cdot G'$$

$$[y_{1j} \cdots y_{9j}\, y_{13j}\, y_{14j}\, y_{15j}] = [x_{1j} \cdots x_{9j}] \cdot \begin{bmatrix} \overset{9\times 9}{\begin{matrix} 1 & & 0 \\ & \ddots & \\ 0 & & 1 \end{matrix}} & \overset{9\times 3 \text{ submatrix}}{\begin{matrix} g_{13,1} & g_{14,1} & g_{15,1} \\ g_{13,2} & g_{14,2} & g_{15,2} \\ \vdots & \vdots & \vdots \\ g_{13,9} & g_{14,9} & g_{15,9} \end{matrix}} \end{bmatrix}$$

$y_{ij} = x_{ij} \qquad i = 1, 2, \ldots, 9$

WILDCARD COMPUTATIONS $e_{1j} = y_{13j} = x_{1j}\, g_{13,1} + x_{2j}\, g_{13,2} + \ldots + x_{9j}\, g_{13,9}$ $e_{2j} = y_{14j} = x_{1j}\, g_{14,1} + x_{2j}\, g_{14,2} + \ldots + x_{9j}\, g_{14,9}$ $e_{3j} = y_{15j} = x_{1j}\, g_{15,1} + x_{2j}\, g_{15,2} + \ldots + x_{9j}\, g_{15,9}$ Contributions for packet $X_1$, byte j  
Contributions for packet $X_2$, byte j  
Contributions for packet $X_{12}$, byte j

METHOD FOR PACKET-LEVEL FEC ENCODING, IN WHICH ON A SOURCE PACKET-BY-SOURCE PACKET BASIS, THE ERROR CORRECTION CONTRIBUTIONS OF A SOURCE PACKET TO A PLURALITY OF WILDCARD PACKETS ARE COMPUTED, AND THE SOURCE PACKET IS TRANSMITTED THEREAFTER

CROSS-REFERENCE TO A RELATED APPLICATION

This application claims the benefit of U.S. Provisional Application No. 60/128,163, filed Apr. 6, 1999.

BACKGROUND OF THE INVENTION

1. Field of the Invention

The present invention relates to a method for reliably encoding data streams to be transmitted in various types of communication and computer systems, for example, a one-way satellite broadcast system between a host computer and a subscriber computer.

2. Description of the Related Art

U.S. patent application Ser. No. 08/785,443, which is incorporated herein by reference, discloses a forward error correction (FEC) encoding method for reliably transferring packets of data between a transmitter and receiver in a computer network or communication system. In particular, that patent application provides various packet-level FEC encoding techniques to ensure that large, multimedia data files, including digitized music, still images or moving images, such as may be transmitted by a host computer to one or more receiver subscriber computers using one-way satellite broadcasting, are received error free despite the effects of various types of noise interfering with the transmitted signal.

In many computer networks or communication systems, including the aforementioned one-way satellite broadcast system, the data bits or symbols (such as octets or bytes) are organized into larger groups called packets. When a file is transmitted, uncoded header packets preceding the information-containing packets are sent. Those header packets contain the address and control information to ensure that the following information packets are received by the addressed subscriber computers. Moreover, each packet itself includes uncoded header bytes that indicate, inter alia, to which file the packet belongs and the position of the packet within that file. The remaining bytes of the packet are the body which includes the informational data, such as compressed video data. For example, a packet may be 4,096 bytes long, wherein the header portion is the first 16 bytes, and the body portion is the remaining 4,080 bytes. A large digital object is thus transmitted as a sequence of "original" or "source" packets.

In the techniques described in U.S. patent application Ser. No. 08/785,443, an extra number of error correcting "wildcard" packets are encoded and transmitted with the original packets to provide a predetermined level of protection against packet loss. For example, if a file contains 180 original packets, an extra 20 wildcard packets may be encoded and transmitted with those 180 original packets, as shown in FIG. 1A, to provide against a loss of 20 original packets (approximately an 11% loss). For the reasons described in that patent application, the addressed subscriber computers can successfully reconstruct the large digital object from the received packets so long as any 180 packets, of the 200 packets transmitted, are successfully received.

Additionally, as also described in U.S. patent application Ser. No. 08/785,443, a large file may be broken into smaller "chunks" or "shares", each of which generally contains the same number of packets, to allow the large file to be more easily transmitted and received by the system. Each share is individually encoded, transmitted, received and reconstructed (decoded). The file is made whole from the individually constructed shares. As also discussed in that application, the packets of the shares may be interleaved to provide additionally protection against the effects of interfering noise. For example, a data file of 360 original packets and 40 wildcard packets may be divided into two shares of 200 interleaved packets each, as shown in FIG. 1B. Of course, as the files become larger, the number of shares will increase.

As disclosed in U.S. patent application Ser. No. 08/785,443, packet-level error detection processing in the receiving subscriber computers provides an indication that a received packet is "good" or "bad". Also, an indication is made if a packet has not been received at all, i.e., "lost". The bad packets are marked as lost and are not used in further decoding. As further explained therein, as long as the number of lost packets does not exceed the number of wildcard packets, the original packets of the file or share may be completely and correctly reconstructed. Continuing the above examples, for each file or share, at least 180 packets of the 200 transmitted packets must be received as "good" packets for the successful reconstruction of the original 180 packets. The techniques for decoding the received good packets to reconstruct the original packets are described more fully in U.S. patent application Ser. No. 08/785,443.

In U.S. patent application Ser. No. 09/179,083, the above-described file-oriented packet-level encoding and decoding techniques of U.S. patent application Ser. No. 08/785,443 are extended from data files to data "streams". In the computer network/communication system arts, a stream may be a continuous sequence of octets (or bytes) without a packet structure, as in the phrase "TCP (transmission control protocol) is a stream-based protocol". On the other hand, a stream may be a continuous sequence of packets. For example, when those skilled in the art use the phrase "video (or audio) streaming", they are usually referring to a stream of UDP/IP (user datagram protocol/internet protocol) or IP Multicast packets. For the present application, a stream is generally any data arriving over a period of time which must be processed and transmitted as it arrives, without waiting for the data to end. Usually, the data is generated by an independent source, and at any given point in time the transmitting system has no knowledge of if or when future data will arrive.

In U.S. patent application Ser. No. 09/179,083, data streams are assembled into "virtual files" of packets, and then the file-oriented encoding and decoding techniques of U.S. patent application Ser. No. 08/785,443 are applied thereto. That is, the host computer collects the data of the streams into packets, and the packets are collected into a virtual file. The virtual file is then encoded by the host computer using the techniques of U.S. patent application Ser. No. 08/785,443, and the encoded packets are transmitted to the subscriber computers. At the subscriber computer side, the packets are received and collected into a virtual file, which is then decoded using the techniques of U.S. patent application Ser. No. 08/785,443. Once the virtual file is decoded, it is output by the subscriber as a stream of packets, or as a stream of unpacketized data if applicable. However, the method described in U.S. patent application Ser. No. 09/179,083 has a drawback in that delays are created when the host computer waits for data to arrive from the source so it can be packetized and made into a virtual file. Another delay is created as the subscriber computer waits for the arrival of all of the packets required to reconstruct the virtual file. Further, a great deal of memory, and associated read/write operations, is required for storing the virtual file.

Accordingly, to remove these delays from the "virtual file" method of encoding data streams, and to reduce the memory requirements thereof, it would be desirable to encode and decode data streams directly, that is, without the creation of virtual files. However, there are complications when working with data streams as opposed to virtual files. It is usually desirable, or sometimes necessary, to process the data streams in a timely fashion with minimal delays. Such a restriction generally rules out the ability to request retransmission of missed data, and thus, it is important that a reliable encoding scheme for one-way transmission be used. To additionally minimize delays, the host computer should be capable of receiving stream data from the source at a rate similar to the original stream. Moreover, unlike virtual files, when data streams are encoded, there is a lack of knowledge at the host computer, at any given point in time, if and when future data will be coming. This uncertainty of future data must be accounted for in the encoding process. Further, past data may also be unknown, as the host computer may start receiving data from a source in midstream, such as in "live" video/audio transmissions.

SUMMARY OF THE INVENTION

Accordingly, it would be desirable to provide a method that encodes streams of source packets directly that overcomes the above-described problems. To accomplish this, a method is provided in which, when a packet of data arrives from a source, or a packet is formed from arriving source data bits or octets, the packet's error-correcting contribution to a group of wildcard packets is computed. Once that computation is done, the packet can then be transmitted to the subscriber computer without waiting for the arrival of any other source packet, thus making the encoding process nearly instantaneous. In particular, advantage is taken of the identity submatrix of the encoding generator matrix described in U.S. patent application Ser. No. 08/785,443, which causes the encoded source packets to be identical to the original source packets. Thus no actual encoding of the source packets is required, and the source packets may be transmitted as soon as the computation of its wildcard contributions has been completed. The contributions from the source packets to each wildcard packet of the group are summed, and when all of the contributions have been computed for all of the wildcard packets associated with the group of source packets, the wildcard packets are transmitted. At the receiver, the source packets may be reconstructed from the received packets using the packet-level decoding techniques set forth in U.S. patent application Ser. No. 08/785,443.

In another aspect of the invention, if a timeout occurs at the host computer because no further stream data is forthcoming, or a signal is received from the source indicating that the data stream has ended, an appropriate set of wildcard packets is transmitted, thus preventing the data stream information from becoming stale. Optionally, the number of wildcards sent, as compared to the total number of wildcards normally computed for the group, may be proportional to the number of source packets actually received by the host computer, as compared to the number of source packets normally received by the host computer when no timeout occurs.

BRIEF DESCRIPTION OF THE DRAWINGS

The various aspects of the present invention can be best understood by reference to the detailed description of the preferred embodiments set forth below taken with the drawings, in which:

FIG. 3 shows the formula for computing the contributions for each source packet to the wildcard packets in accordance with the general case of the present invention;

FIG. 5 shows the formula for computing the contributions for each source packet to the wildcard packets in accordance with the timeout case of the present invention.

DETAILED DESCRIPTION OF THE PREFERRED EMBODIMENTS

General Case

Figure 2:
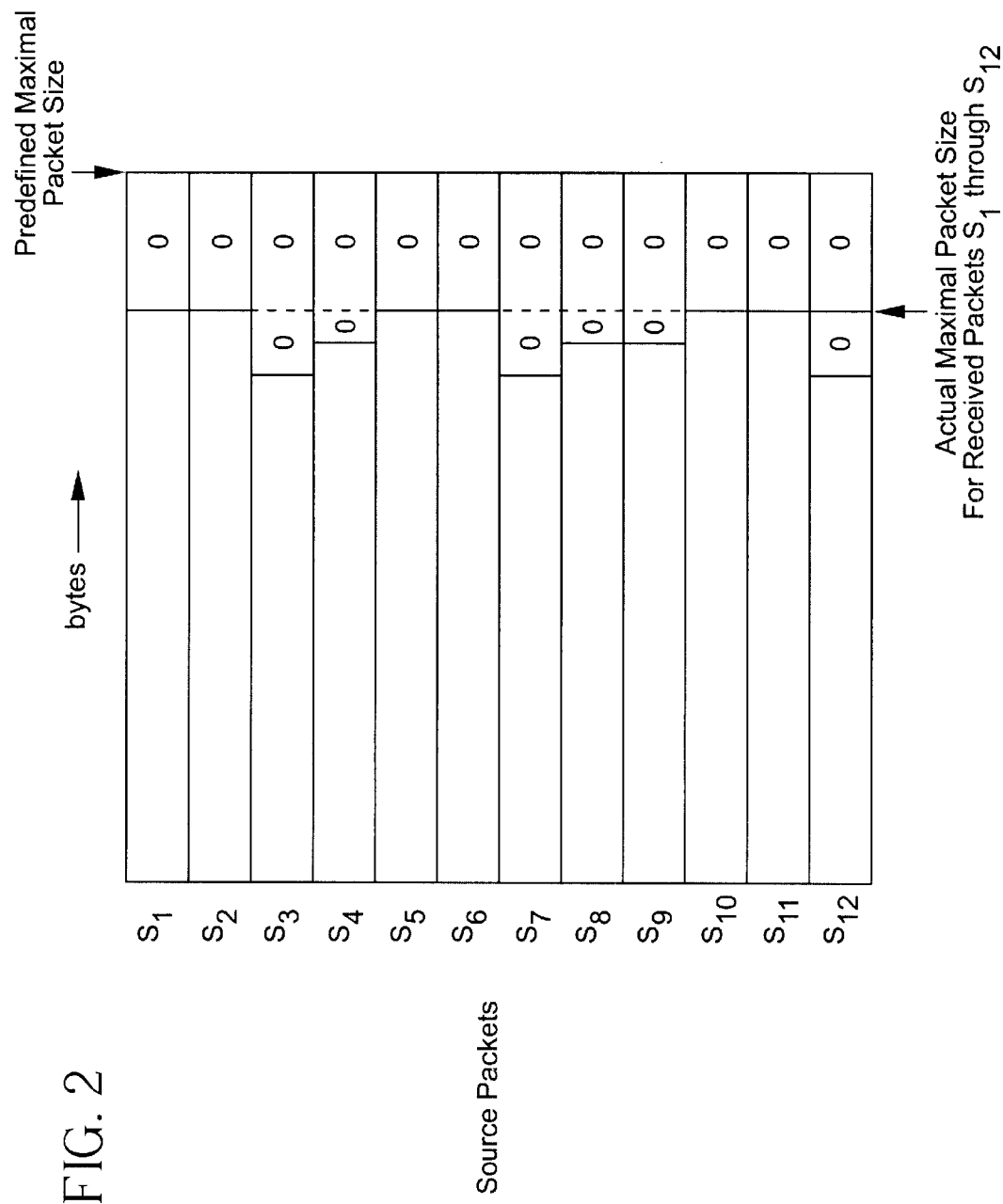
FIG. 2 depicts a block of 12 packets received from a source by a host computer.

A typical input to the host computer is video or audio data in the form of (1) an octet, byte, or bit-stream (hereinafter collectively referred to as "bit-stream"), (2) a file, or (3) a packet stream. If the source is a bit-stream, the data is formed into packets, preferably of equal-size, thus creating a packet stream. Similarly, if the source is a file, the host computer may treat that file as a bit-stream, and packetize the same, preferably in equal size packets, to create a packet stream. Accordingly, regardless of the type of input source data, the host computer will encode source (or "original") data packets, and will transmit encoded packets comprising both source packets and wildcard packets to one or more subscriber computers. In the general case, it is preferred that for a given packet stream, there is a small standard deviation in source packet size and that the average source packet size is very close to the actual maximal packet size (relatively large variations in packet size will be discussed below). This provides a method that is efficient from both information-theoretic and performance point-of-views. A typical block of source packet data input to the host computer is shown in FIG. 2.

Although the computations are performed on a per-source packet basis, it is assumed that the wildcard packets are computed over a group of k source packets, for example, 12 source packets ($s_1$ through $s_{12}$). The number n-k of error correcting wildcard packets required for each group of k source packets is selected by the host computer operator based on the expected number of packets to be lost during transmission due to interfering noise, as explained in U.S. patent application Ser. No. 08/785,443. For example, it may be expected that a maximum 4 packets will be lost during transmission out of every n=16 packets transmitted (a 25% loss), and thus n-k=4 wildcard packets ($e_1$ through $e_4$) will have to be computed for every k=12 source packets. It should be appreciated that these numbers have been chosen to more easily demonstrate the present invention, as actual loss rates are usually much smaller on average (0 to 5%).

The error correcting contribution of every source packet "s" to the error-correcting wildcard packets "e" is computed as shown in FIG. 3. Each original source packet $s_1$ is prefixed with a data field of a few bytes indicating the length of the packet. The resulting packet (containing length and information data of $s_i$) will be denoted $X_i$. Using the terminology of U.S. patent application Ser. No. 08/785,443, "$X_{ij}$" and "$Y_{ij}$" represent respectively the jth byte of the ith unencoded source packet $X_i$ and the ith encoded packet $Y_i$, wherein $Y_i=X_i$ for i=1, ..., k, and $Y_{k+1}, Y_{k+2}, ..., Y_n$ are the error correcting wildcard packets (for example "$e_1, e_2, e_3$, and $e_4$"). The error correcting contributions are calculated for each byte j of source packet i. The kxn encoding generator matrix G is computed as set forth in U.S. patent application Ser. No. 08/785,443, wherein the first kxk rows and columns form the identity matrix I (see FIG. 5 of U.S. patent application Ser. No. 08/785,443). Accordingly, the first k encoded packets are identically the k source packets, and thus no actual encoding computations, save for the wildcard contributions, need be performed for those packets. Accordingly, the host computer may transmit each source packet of a group immediately after computing its contribution to the wildcard packets of the group. By doing this, encoding delays at the host computer may be minimized, and there is no need to write and read the source packet into and out of memory. The predominant computational and memory costs required at the host computer are related to the wildcard packets, which are relatively minor compared to what would have been required for the source packets had they been first converted into a virtual file.

If the number of bytes in any given packet s is less than the predefined maximal packet size of the block, than the remaining bytes of that packet are padded with zeroes. In other words, any blank spaces in the block shown in FIG. 2 are treated as zeroes for encoding purposes. For example, $s_1$, and $s_2$ have a length equal to the actual maximal packet size for data stream, while both are smaller than the predefined maximal packet size for the block. The blank space to the right of $s_1$ and $s_2$, as well as the other source packets, are thus treated as zeroes when the wildcard contributions are computed. It should be noted that none of the extra zeroes are transmitted by the host computer.

For example, when a frame of video is packetized by the source, it is divided into approximately equal-sized packets, each packet having a size of about 1500 bytes. If the predefined maximal packet size of the data block is 1600 bytes, then 100 bytes are filled with zeroes for encoding purposes. The predefined maximal packet size of the block is chosen to greater than the expected actual maximal packet size so as to minimize the need to repacketize the incoming packet stream to fit the block. Although zero-filling results in a small loss of information-theoretic efficiency, it is compensated by better performance efficiency for not having to repacketize data.

Each transmitted source packet has in its header information indicating to which group of encoded packets it belongs, so it may be associated with other source and wildcard packets of that group upon reception. In addition, each source packet's header has a timestamp so the packet's data may be put back into a time-ordered data stream upon reception.

In addition, each source packet has a data field consisting of approximately a few bytes, outside of the header, which indicates the length of the packet. This field precedes the actual information data (for example, video or audio data) of the source packet. This length data is treated like the actual information data in that it is encoded as part of source packet $X_i$. The encoding of the length data is required because when a source packet is lost and recovered, it is recovered with possibly all of the zeroes that were added during the encoding process. Thus, the decoder also needs to recover the packet's length to determine which of those zeroes are actually part of the information data or are merely zero-fill data to be ignored.

The contribution from each of the source packets to each of the wildcard packets of the group are continuously summed as the processing for each source packet is completed. For each wildcard packet, the running summation is performed in a bank of accumulators, one accumulator for each wildcard packet byte, from the first byte to the last byte corresponding to the predefined maximal packet size. The actual maximal packet size shown in FIG. 2 is not actually known until the last of the 12 source packets have been received, and thus each accumulator must be set up to receive a contribution from a source packet as large as the predefined maximal packet size. Accordingly, the wildcards will all be of the same length, that being the actual maximal packet size. In this regard, none of the extra zeroes corresponding to those bytes beyond the actual maximal packet size are transmitted with the wildcard packets.

After the k source packets have been received (or formed) by the host computer from the source and their respective contributions to the wildcard packets have been computed and summed, the n-k wildcard packets are complete and may now be transmitted. The header of each wildcard packet contains information indicating that it is a wildcard packet and to which group of encoded packets it belongs. This allows the received wildcard packets to be correctly associated with the received source packets of the same group at the subscriber computer. In addition, each of the wildcard headers contain information indicating that all k source packets contributed to them. (See below for the timeout case, wherein less than k source packets contributed to the wildcard packets.)

At the subscriber computer, some, if not all, of the n total source and wildcard packets for a given encoding group are successfully received. For that encoding group, if the k source packets have been successfully received, then no decoding is necessary. If the at least k successfully received packets are instead a combination of source and wildcard packets, then one of the wildcard packet's header is checked to see whether or not the wildcard packets were encoded using all k source packets. If so, then any k packets of the at least k successfully received packets may be used to reconstruct the k source packets. The decoding techniques for accomplishing this are explained in detail in U.S. patent application Ser. No. 08/785,443 (see FIG. 3B and accompanying text). (See timeout case below if it is determined from the wildcard header that less than all k source packets contributed to the encoded wildcard packets.)

If less than k packets were successfully received for a given packet encoding group, that is, more than n-k packets were deemed "lost" by the subscriber computer, then all k source packets cannot be reconstructed without error. The subscriber computer must then request retransmission of the missing source packets, if possible, or otherwise make do with whichever source packets were successfully received (for example, the data of the unreconstructable missing source packets may in certain circumstances be replaced with, or estimated from, data of successfully received source packets). However, careful selection of the number of wildcard packets by the host operator should greatly minimize the occurrence of this event.

It should be noted that the entire process described above is repeated for arriving source packets (e.g., $s_{13}, s_{14}, s_{15}, \ldots$) until the data stream ends.

Timeout Case

Unfortunately, unlike well-defined files, when working with data streams the host computer does not know at any given point in time if or when future data will arrive. The "timeout case" extends the above-described general case to those instances when less data has been received than was originally expected, as follows.

Figure 4:
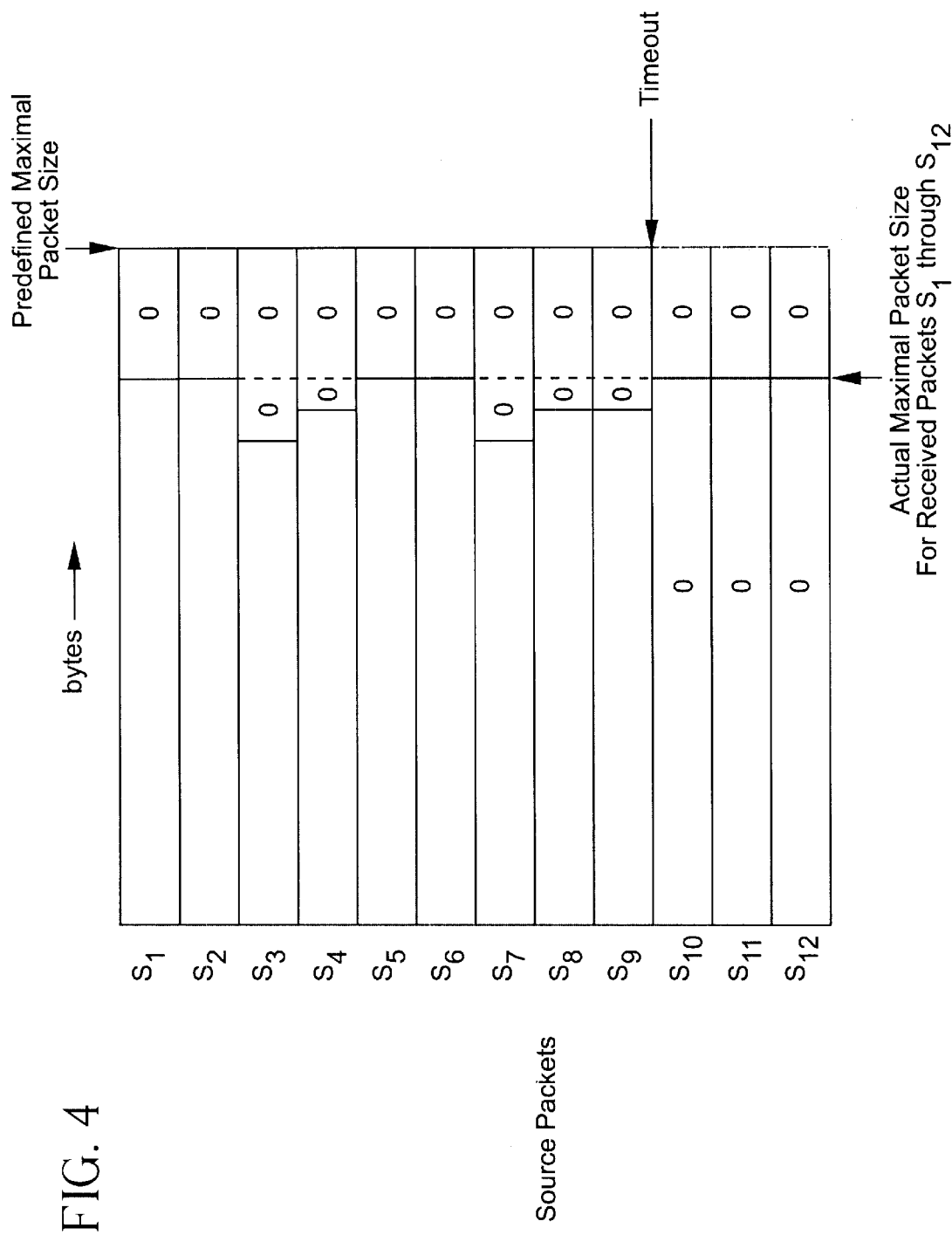
FIG. 4 depicts a block of 9 packets received from a source by a host computer.

As shown in FIG. 4, the first 9 of k=12 source packets, denominated $s_1$ to $s_9$, arrive in the host computer, and are processed as discussed above in the general case. However, the last 3 packets, $s_{10}$, $s_{11}$, and $s_{12}$, never arrive. Eventually, a timeout condition in the host computer occurs. A timeout occurs when no data has been received by the host computer from the source within a predetermined time interval since receipt of the last packet. Alternatively, a signal may be sent from the source and received by the host computer, the signal indicating that the data stream has ended.

In either situation, since $s_{10}$, $s_{11}$, and $s_{12}$, never arrived at the host computer, they are treated as zero (they need not be transmitted). Thus, $X_{10}$, $X_{11}$, and $X_{12}$ in the formula shown in FIG. 3 are zero, and the error correction contributions resulting therefrom are also zero.

Instead of sending all of the wildcard packets, the number of wildcard packets sent may be adjusted proportionally. This is because the other wildcard packets are not required for error-free reconstruction. In this example, since only 75% (9 of 12) of the source packets of the group arrived and contributed to the computations of the wildcard packets, only 75% (3 of 4) of the wildcard packets need be transmitted. Thus, only wildcard packets $e_1$, $e_2$ and $e_3$ are transmitted in this example. Further, the respective headers of these wildcard packets contain information indicating that only 9 source packets contributed to their formation. Although in this example only one wildcard is not sent, reducing the number of transmitted wildcard packets generally can result in a substantial savings when dealing with groups of large numbers of packets. For example, assuming the number of source packets in a group is 2000 and the number of wildcard packets for that group is 500, if a timeout occurs after only 20 source packets (1%) have been received by the host computer, it is preferable to send only 5 wildcard packets (1%) than all 500 wildcard packets.

Because $s_{10}$, $s_{11}$, and $s_{12}$ are treated as zero, the formula in FIG. 3 may be rewritten as shown in FIG. 5. In the formula shown in FIG. 5, G' is a 9×12 matrix comprising the concatenation of a 9×9 identity matrix I with a 9×3 submatrix consisting of the first 9 rows and first three columns of the 12×4 submatrix shown in FIG. 3. G' is a row-reduced form of a Vandermonde matrix, and thus the encoding/decoding techniques of U.S. patent application Ser. No. 08/785,443 can be applied to the transmitted packets $s_1$, $s_2$, ..., $s_9$, $e_1$, $e_2$, $e_3$. One skilled in the art will appreciate that G' is not the same as the encoding (generating) matrix that would normally be used to create 3 wildcards from 9 source packets, but differs therefrom only in an arbitrary choice of constants used to pick a Vandermonde matrix.

In summary, in the general case an encoding/decoding technique is used in which all of the packets $s_1$, $s_2$, ..., $s_{12}$ can be perfectly reconstructed from any 12 packets taken from the set $\{s_1, s_2, \ldots, s_{12}, e_1, e_2, e_3, e_4\}$. But in the timeout case, the host computer timed out before receiving $s_{10}$, $s_{11}$, and $s_{12}$, so the host computer pretends that there are imaginary source packets $s_{10}$, $s_{11}$, $s_{12}$ consisting of all zeroes and sends out only $s_1$, $s_2$, ..., $s_9$, $e_1$, $e_2$, $e_3$, wherein each wildcard packet $e_1$, $e_2$, $e_3$ contains information in its header that $s_{10}$, $s_{11}$, $s_{12}$ are imaginary all-zero packets. Thus, $s_1$, $s_2$, ..., $s_9$ may be reconstructed from any 9 of the packets that were sent:

subcase 1: $s_1$, ..., $s_9$ are successfully received, and no decoding is required.

subcase 2: at least nine packets are received, including at least one of the wildcard packets. The header of any of the received wildcard packets tells the subscriber computer that it was formed with less than all k=12 source packets, and in particular, that it was formed with source packets $s_1$ to $s_9$, and thus the subscriber computer knows that $s_{10}$, $s_{11}$, $s_{12}$ are imaginary all-zero packets, that is, that $s_1$, $s_2$, ..., $s_9$, $e_1$, $e_2$, $e_3$ satisfy the relationship set forth in FIG. 5. Thus, $s_1$, ..., $s_9$ may be reconstructed using any nine of the received packets with the decoding technique set forth in detail in U.S. patent application Ser. No. 08/785,443 detail (see FIG. 3B and the accompanying text thereof).

It should be noted that in subcase 1, the subscriber computer does not actually know that all of the transmitted source packets have been received, because source packets $s_1$, ..., $s_9$ were transmitted before the host computer knew that there was not going to be a real source packet $s_{10}$. Thus, the subscriber computer must either wait for the receipt of additional source packets $s_{10}$ to $s_{12}$, which would indicate the general, non-timeout case, or the receipt of one of the wildcard packets, the header of which would indicate how many source packets were used to create it.

Variations of Packet Size

In the general case, it is preferred that the packet-based data stream input to the host computer has a small standard deviation in source packet size and that the average source packet size is very close to the actual maximal packet size, which in turn must be smaller than the predefined maximal packet size (see FIG. 2). In this case, the source packet sizes will be same or about the same as the wildcard packet size (i.e., the actual maximal packet size), which provides nearly the most efficient coding from an information-theoretic point of view. However, given the variation of packet sizes among the different types of sources and conditions, the preferred data stream is not always provided to the host computer. The host computer can handle these variations in packet sizes as follows.

In one case, the source packets are generally uniform, such as shown in FIG. 2, but occasionally a very large source packet arrives that is either greater than the predefined maximal packet size or the average size of previously-arriving packets. In this situation, the host computer simply breaks that very large source packet into two or more smaller packets, each of whose size is less than the predefined maximal packet size and preferably close to the sizes of the previously-arriving packets.

In another case, the data stream generally consists of many very large packets (beyond the predefined maximal packet size), and/or packets of widely variable or unpredictable size. Accordingly, the source packets either cannot be encoded because they are too large, or the encoding becomes greatly inefficient from an information-theoretic point-of-view. In this situation, it would be preferable to "repacketize" the packets to ensure that their sizes are less than the predefined maximal packet size and/or to reduce their variability in size. To accomplish repacketizing, the packet stream is converted into a bit-stream, which is then reconverted into a packet stream with packets of approximately equal size. Repacketizing, however, adds a delay into the encoding process.

Other Embodiments

Wildcard and source packets may be sent, in parallel, on separate transmission channels. For example, it may be desirable to send a digital television signal (or digital audio signal) which can be used by traditional equipment (which would suffer in terms of quality when outages due to noise occurred) as well as by high-quality systems which could make use of the error-correction wildcard information. The error-correction wildcard information could be sent on a separate channel on the satellite network, or with a separate packet identifier (PID) in the case of a digital video broadcast (DVB) system. To accomplish this, a channel multiplexer would be required.

Figure 1:
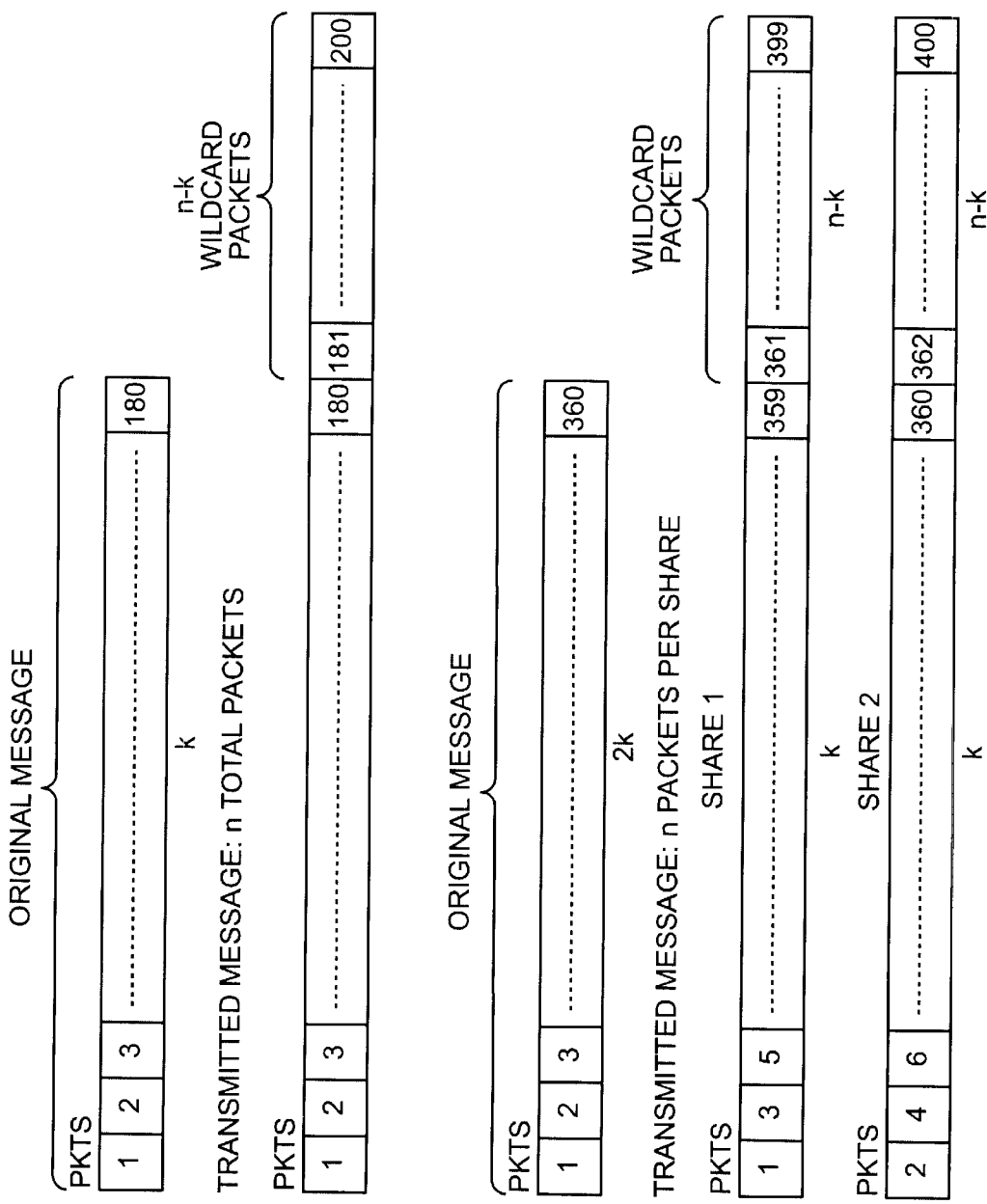
FIG. 1A depicts an example of a file of packets including original packets and wildcard packets.
FIG. 1B depicts an example of a file with shares of interleaved packets.

In addition, the above-described data stream encoding method may be extended so that the packets are interleaved, by utilizing the file interleaving methods described in detail in U.S. patent application Ser. No. 08/785,443. One share of interleaved packets may be transmitted to the subscriber computer at the same time as several other shares of interleaved packets, as shown in FIG. 1B for two interleaved shares.

Of course, it will be appreciated that the invention may take forms other than those specifically described, and the scope of the invention is to be determined solely by the following claims.

What is claimed is:

1. A method for encoding a stream of source packets, in which a plurality of k source packets are packet-level forward error correction encoded to form a plurality of n-k error-correcting wildcard packets, the k source packets and n-k wildcard packets to be transmitted to a receiver, comprising the steps of:

after the arrival of each source packet, for each byte of said source packet, computing the respective error correction contributions to the corresponding bytes of said plurality of wildcard packets;

transmitting said source packet to the receiver without waiting for the arrival of another source packet of said plurality of source packets;

for each wildcard packet byte, summing said error correction contribution of the source packet in an accumulator;

after the error correction contributions have been computed using all k source packets and summed for all n-k wildcard packets, transmitting the wildcard packets to the receiver.

2. A method for encoding a stream of source packets, in which a plurality of k source packets are packet-level forward error correction encoded to form a plurality of n-k error-correcting wildcard packets, the k source packets and n-k wildcard packets to be transmitted to a receiver, comprising the steps of:

after the arrival of each source packet, for each byte of said source packet, computing the respective error correction contributions to the corresponding bytes of said plurality of wildcard packets;

transmitting said source packet to the receiver without waiting for the arrival of another source packet of said plurality of source packets;

for each wildcard packet byte, summing said error correction contribution of the source packet in an accumulator, but if no source packet has arrived within a predetermined period of time after a previously-arriving packet k', the remaining k–k' source packets are assumed to be zero, resulting in an error correction contribution of zero for those k–k' packets;

after the error correction contributions have been computed using the k' source packets and summed for all n-k wildcard packets, transmitting the wildcard packets to the receiver.

3. A method according to claim 2, wherein the number of wildcard packets computed and transmitted, as compared to the n-k wildcard packets, are proportional to the k' actually arriving packets, as compared to the expected k source packets.

* * * * *